United States Patent [19]

Naka et al.

[11] 4,060,656

[45] Nov. 29, 1977

[54] SUPPORT FOR PHOTOSENSITIVE RESIN

[75] Inventors: Kiyomi Naka, Hino; Teruo Takahashi, Kunitachi, both of Japan

[73] Assignee: Teijin Limited, Osaka, Japan

[21] Appl. No.: 596,189

[22] Filed: July 15, 1975

Related U.S. Application Data

[63] Continuation-in-part of Ser. No. 455,679, March 28, 1974, abandoned.

[30] Foreign Application Priority Data

Apr. 2, 1973 Japan .................................. 48-37546

[51] Int. Cl.$^2$ ................................................ G03F 7/02
[52] U.S. Cl. ........................................ 428/355; 96/33; 96/86 P; 96/115 P; 96/87 R; 96/85; 204/159.15; 260/47 EP; 260/830 R; 260/830 P; 260/830 TW; 260/834; 260/78.41; 427/386; 428/413; 428/414; 428/416; 428/418
[58] Field of Search ............... 428/355, 413, 414, 416, 428/418; 96/33, 86 P, 115 P, 87 R, 85 P; 204/159.15; 427/386; 260/47 EP, 830 R, 830 P, 830 TN, 834, 78.41

[56] References Cited

U.S. PATENT DOCUMENTS

| 3,036,913 | 5/1962 | Burg et al. ................................. 96/67 |
| 3,186,844 | 6/1965 | Alles et al. ............................ 96/87 R |
| 3,287,152 | 11/1966 | Alles et al. ............................ 96/87 R |
| 3,782,952 | 1/1974 | Golda et al. ..................... 204/159.15 |
| 3,826,650 | 7/1974 | Schlesinger ........................... 96/35.1 |
| 3,882,187 | 5/1975 | Takiyama et al. .............. 204/159.15 |
| 3,890,149 | 6/1975 | Schlesinger et al. ..................... 96/33 |
| 3,894,873 | 7/1975 | Kobyashi et al. ......................... 96/33 |
| 3,899,611 | 8/1975 | Hall ................................. 204/159.15 |
| 3,903,322 | 9/1975 | Ravve et al. ......................... 427/386 |

*Primary Examiner*—Ralph S. Kendall
*Assistant Examiner*—John D. Smith
*Attorney, Agent, or Firm*—Sherman & Shalloway

[57] ABSTRACT

A support for a photosensitive resin for use in making a printing plate using a liquid photosensitive resin, said support comprising a flexible self-supporting base plate and an adhesive layer formed thereon for applying a layer of the photosensitive resin, wherein said adhesive layer is a three-dimensional cured product containing 1 $\times$ 10$^{-4}$ to 1 $\times$ 10$^{-2}$ mol/gr. of the effectively photopolymerizable unsaturated carbon-to-carbon double bond, which has been formed from a composition consisting of (A) a compound containing at least two 1,2-epoxy groups in the molecule; (B) a compound selected from one of the group comprising (i) a compound containing an effectively photopolymerizable unsaturated carbon-to-carbon double bond and a 1,2-epoxy group in the molecule and having a boiling point of at least 120° C., or (ii) a compound containing an effectively photopolymerizable unsaturated carbon-to-carbon double bond and an amino group in the molecule and having a boiling point of at least 120° C.; and (C) an organic curing agent.

13 Claims, No Drawings

SUPPORT FOR PHOTOSENSITIVE RESIN

This application is a continuation-in-part application of U.S. Ser. No. 455,679 filed Mar. 28, 1974 now abandoned.

This invention relates to a flexible support for preparing a printing plate consisting of the support and a layer of a liquid photosensitive resin applied in situ to the support and solidified upon exposure, especially to a support including an adhesive layer for firmly bonding the solidified photosensitive resin layer to the support.

Photosensitive resin plates for use in relief printing plates have been previously known. These plates are usually composed of a base of a metal plate or plastic sheet, an adhesive layer (for facilitating the adhesion of a photosensitive resin layer to the base plate), and a photosensitive layer. Generally, an antihalation layer is provided between the adhesive layer and the base. The adhesive layer should not contain a component which prevents the photosensitive resin layer from polymerizing by light or which initiates the polymerization in the absence of light, and should also be firmly bonded to the support so that there will be no separation of relief from the support during printing. Furthermore, the adhesive layer is required to maintain its adhesive strength against influences encountered during the plate making or printing process, such as the temperature, humidity, or solvent.

In order to improve the chemical resistance of the adhesive layer, there has already been proposed a technique whereby a cross-linked partially hardened barrier layer is provided between the adhesive layer and the photosensitive resin layer (Japanese patent publication Nos. 23761/61, corresponding to U.S. Pat. No. 3,036,913, and 12104/65, corresponding to U.S. Pat. Nos. 3,186,844 and 3,287,152). This technique is intended to prevent the reduction of the adhesive strength of the adhesive layer which occurs as a result of the attacking of the contact surface between the photosensitive resin layer and image relief areas by a developing solution when washing out the uncured portion of the photosensitive resin. This method, however, is economically disadvantageous because of troublesome control of the conditions for coating a barrier wall forming composition on the adhesive layer and partially hardening the barrier wall layer. Furthermore, the polymerization reaction taking place during the formation of the barrier wall layer renders the thin base plate extremely warped, and frequently causes marked disadvantages in the subsequent operations.

An object of this invention is to provide a support useful for making a printing plate which is not melted by heating and is not easily attacked by water, acid, alkali, organic solvents, or printing ink, and in which reliefs composed of a photosensitive resin are firmly bonded to the support by an adhesive layer.

Another object of this invention is to provide a support useful for making a printing plate which does not break even by the repetition of external forces and has superior resistance to printing.

Still another object of this invention is to provide an adhesive composition capable of forming an adhesive layer which is not melted by heating and is not attacked by water, acid, alkali, organic solvents or printing ink, secures a firm bonding of reliefs composed of a photosensitive resin to the support, and is not separated by repeated external forces exerted on the printing plate.

The above objects of this invention can be achieved by a support for a photosensitive resin for use in making a printing plate using a liquid photosensitive resin, said support comprising a flexible self-supporting base plate and an adhesive layer formed thereon for applying a layer of the photosensitive resin, wherein said adhesive layer is formed from a composition consisting of (A), (B) and (C), shown below.

A. a compound containing at least two 1,2-epoxy groups in the molecule,
B. a compound selected from one of the group comprising
  i. a compound containing an effectively photopolymerizable unsaturated carbon-to-carbon double bond and a 1,2-epoxy group in the molecule and having a boiling point of at least 120° C., or
  ii. a compound containing an effectively photopolymerizable unsaturated carbon-to-carbon double bond and an amino group in the molecule and having a boiling point of at least 120° C.; and
C. an organic curing agent containing at least two active hydrogen atoms but not containing an effectively photopolymerizable carbon-to-carbon double bond, or an organic compound convertible to said curing agent during the reaction.

Examples of preferred compounds having at least two 1,2-epoxy groups in the molecule [component (A)] are linear polycondensation products formed between epichlorohydrin and polyhydric phenolic compounds, for example, epoxy resins, having a molecular weight of 400 to 4,000 obtained by condensing 2,2-bis(4'-oxyphenyl) propane (i.e., bisphenol A) with epichlorohydrin in an alkali solution, epoxy resins obtained from novolac resins synthesized from phenol and formaldehyde, and epichlorohydrin, or epoxy resins obtained by condensing a condensate of resorcinol and acetone with epichlorohydrin in an alkaline solution. Of these, linear polycondensation products of the following formula, in which $n$ is 0 or at least 1, formed between bisphenol A and epichlorohydrin are especially preferred.

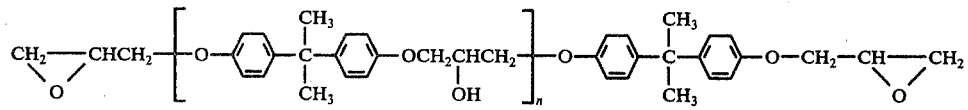

Other examples including a compound of the following formula

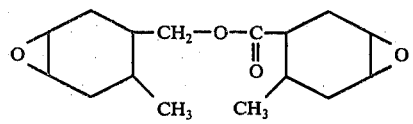

(prepared by subjecting butadiene and crotonaldehyde to a Diels-Alder reaction, and condensing two molecules of the resulting 4-formyl-3-methyl-cyclohexene, followed by epoxidization), vinyl cyclohexene dioxide, dipentene dioxide, and diepoxy ester compounds such as diglycidyl 2,6-naphthalenedicarboxylate, diglycidyl 2,7-naphthalenedicarboxylate, diglycidyl 1,5-naphthalenedicarboxylate, diglycidyl o-phthalate, diglycidyl isophthalate, diglycidyl terephthalate, diglycidyl methylisophthalate, diglycidyl methylterephthalate.

Examples of the compound having an effectively photopolymerizable carbon-to-carbon double bond and a 1,2-epoxy group in the molecule and having a boiling point of at least 120° C. [component (B) (i)] are glycidyl acrylate, glycidyl methacrylate, glycidyl allyl ether, o-allyl phenyl glycidyl ether, crotyl phenyl glycidyl ether, methallyl glycidyl ether, epoxy acrylate type resins obtained by condensing a part of the epoxy group of the polyepoxy compound exemplified above as component (A) with acrylic acid or methacrylic acid, epoxy acrylate type resins obtained by adding acryloyl chloride to the side chain of the polyepoxy compound exemplified above as component (A), especially an epoxy resin obtained by the condensation of bisphenol A and epichlorohydrin, and polyepoxy compounds obtained by epoxidizing some of the many carbon-to-carbon double bonds present in polybutadiene obtained by anionic polymerization.

Of these, glycidyl acrylate, glycidyl methacrylate and epoxy acrylate type resins are used preferably.

Examples of the compound having an effectively photopolymerizable carbon-to-carbon double bond and an amino group and having a boiling point of at least 120° C. [component (B) (ii)] are reaction products of the component (B) (i) with amine curing agents to be described in detail, preferably reaction products obtained by reacting glycidyl acrylate, glycidyl methacrylate or glycidyl allyl ether with a part of the active hydrogens of polyamines such as hexamethylene diamine, more preferably reaction products formed between glycidyl methacrylate and polyamide resins.

The term "effectively photopolymerizable carbon-to-carbon double bond", as used in the present specification and appended claims, denotes

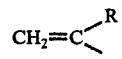

wherein R is a hydrogen atom or an alkyl group, that is, an α-substituted vinyl group.

In the present invention, known curing agents for epoxy resins, for example, compounds having at least two active hydrogen atoms in the molecule, for example, aliphatic amines, hydroxyamines, aromatic amines, polycarboxylic acids, acid anhydrides, or tertiary amines, can be used as the curing agent [component (C)] without any particular restriction. Examples of the curing agents usable in this invention are aliphatic amines such as ethylene diamine, diethylene triamine, or diethylaminopropylamine, hydroxyamines such as monoethanolamine, diethanolamine, N-methylethanolamine or aminoethylethanolamine, aromatic amines such as metaphenylene diamine, or p,p'-diaminodiphenylmethane, amines obtained by replacing a part of the active hydrogens of these amines by an aliphatic or aromatic radical, such as N,N-diethyl ethylenediamine, or dimethyl p-toluidine, acid anhydrides such as phthalic anhydride, maleic anhydride, hexahydrophthalic anhydride, dodecenylsuccinic anhydride, pinelic anhydride, or hexachloro-endomethylenetetrahydrophthalic anhydride.

The use of the acid anhydrides makes it possible to increase the thermal resistance of the adhesive layer of the support. Preferably, the acid anhydride is used together with a small amount of water, an amine or an alcohol.

Examples of other usable curing agents include polycarboxylic acids such as phthalic acid, phenol resins, urea resins, polyester resins, polysulfide resins, melamine resins, polyamide resins, polymeric compounds having many active hydrogens, such as polyamines, tertiary amines such as triethylamine or benzyldimethylamine, organic amine complex salts such as trialkalnolamine boric acid salts, and metal compounds such as $(C_4H_9)_2Sn(OCOC_{11}H_{23})_2$, $Ca[Al(OC_4H_9)_4]_2$ or $(C_4H_9O)_4Ti$.

Of these curing agents, an amino-terminated polyamide resin obtained by the condensation of an aliphatic dicarboxylic acid with ethylene diamine and having a degree of polymerization of 5 to 20 is especially useful because of its ability to provide moderate affinity between the cured film on the support and the liquid photosensitive resin.

The adhesive layer of the support in accordance with this invention is a cured three-dimensional polymer formed by applying a composition consisting of components (A), (B) and (C) to the surface of a flexible self-supporting base plate, and allowing the individual components to react with each other. The three-dimensional polymer contains effectively photopolymerizable unsaturated carbon-to-carbon double bonds in an amount of $1 \times 10^{-4}$ to $1 \times 10^{-2}$, preferably $1 \times 10^{-3}$ to $4 \times 10^{-3}$, per gram of polymer.

The amount of the abovementioned unsaturated carbon-to-carbon double bond is measured in accordance with a so-called Hanus' method ["Commercial Method of Analysis", McGraw Hill Book Co., 345–346, 719(1944)] of a qualitative analysis of unsaturated bonds in which the adhesive layer is finely pulverized and then measured by the use of iodine bromide.

The proportions of the components vary according to the combinations of the components. In a composition consisting of components (A), (B) (i) and (C), the proportion of component (A) is 10 to 70% by weight, the proportion of component (B) (i) is 10 to 88% by weight, and the proportion of component (C) is 2 to 80% by weight, the sum of the proportions of these three components being 100% by weight. The preferred proportion is 30 to 60% by weight for component (A), 30 to 68% by weight for component (B) (i), and 2 to 40% by weight for component (C). In a composition consisting of components (A), (B) (ii) and (C), the proportion is 10 to 70% by weight, preferably 30 to 60% by weight, for component (A), 30 to 89% by weight, preferably 30 to 69% by weight, for component (B) (ii), and 1 to 60% by weight, preferably 1 to 40% by weight, for component (C), the sum of the proportions of these three components being 100% by weight. In a composition consisting of components (B) (i) and (C), the proportion is 10 to 98% by weight, preferably 30 to 98% by weight, for component (B) (i), and 2 to 90% by weight, preferably 2 to 70% by weight, for component (C). In a composition consisting of components (A) or (B) (i) and (B) (ii), the proportion is 10 to 90% by weight, preferably 30 to 70% by weight, for component (A) or (B) (i), and 90 to 10% by weight, preferably 70 to 30% by weight, for component (B) (ii).

The components are mixed in the above-specified proportions by well known methods to provide a liquid composition suitable for coating on the surface of the base plate by well known methods.

The coating of the composition is facilitated by dissolving it in an easily volatile solvent. Examples of the solvent are aromatic hydrocarbons such as benzene, toluene, or xylene, alcohols such as n-butanol or diacetone alcohol, ketones such as acetone, methylethyl ketone or methylisopropyl ketone, and acetic acid esters such as ethyl acetate or butyl acetate.

If desired, it is possible to incorporate in the composition an ionic addition-reaction catalyst, or a radical polymerization inhibitor.

The composition coated on the surface of the base plate can be converted to a three-dimensional cured polymer by heating it at 50° C. to 180° C., preferably 80° C. to 130° C. This conversion is substantially completed within about 3 to 30 minutes to form a hard non-tacky adhesive layer. The composition may be aged for 10 to 120 hours at room temperature to 40° C. before the above heating.

The thickness of the adhesive layer is usually 5 to 100 microns to achieve the purpose sufficiently.

The amount of the unsaturated carbon-to-carbon double bond contained in the adhesive layer after conversion to a three-dimensional cured polymer can be controlled according to the proportion of the component (B) (i) or (B) (ii) used, its structure, and the speed of drying.

The flexible self-supporting base plate to be used in this invention may, for example, be a metal plate of iron, stainless steel, zinc or aluminum, a rubber sheet of natural or synthetic rubber, and a film or sheet of cellulose, a cellulose derivative, a polyolefin, a polyester, a polycarbonate or a polysulfone, paper, or a cloth. Good bond strength is obtained with the metal plates such as iron, stainless steel or aluminum, and therefore, these metal plates are used especially preferably. The preferred thickness of the base plate is 0.1 mm to several millimeters. Films or sheets prepared from polymers of photo-polymerizable compositions can also be used.

A filler or reinforcing agent can be incorporated in the base plate. When a base plate which reflects light to a high degree, such as metal plates, is used, the light that has passed through the photosensitive resin layer formed on the support irradiates the surface of the support at any angle excepting 90° C, and reflects, after which it causes polymerization at areas free from images. When such a base material is used, it is recommended to mix a light absorbing agent sufficient for absorbing at least about 50% of the incident actinic light with the three-dimensional polymer layer (adhesive layer), or to form an antihalation layer on the surface of the base plate.

The base plate in the present invention also denotes such a base plate on which an antihalation layer is provided.

The light absorbing agent so mixed or contained in the antihalation layer may either be colorless or colored.

Examples of suitable light absorbing agents are inorganic or organic pigments having absorption in the near ultraviolet region, such as carbon black, trilead tetroxide, titanium dioxide, organic polyazo pigments, benzidine yellow, and Rhodamine, and also benzophenone or benzotriazole compounds which have previously been known as effective ultraviolet absorbents.

The adhesive layer so obtained of the support of this invention is very tough, and the adhesive layers do not break or become tacky when the supports are contacted with each other or stacked in usual handling.

A photosensitive resin plate can be prepared by applying a photopolymerizable photosensitive resin composition to the surface of the support of this invention by known methods such as coating, squeezing, spraying or laminating to form a coating of uniform thickness. A photosensitive resin composion suitable for preparing a relief printing plate contains a compound having a radical addition-polymerizable unsaturated carbon-to-carbon double bond and a photopolymerization initiator activating the above compound by light, and if desired, a solvent-soluble high-molecular-weight polymer for supporting the above compound, for example, a cellulose derivative such as a cellulose ester or cellulose ether, or a polyolefin such as polyvinyl alcohol, a polycondensate such as a polyamide or polyester. Such a photosensitive resin composition is well known.

A relief printing plate is produced from the resulting assembly composed of the photosensitive resin layer, adhesive layer and the support by exposing the photosensitive resin layer through a transparent negative film having image areas, and then treating the exposed layer with a suitable solvent. The exposed portion of the photosensitive resin layer polymerizes substantially integrally with the radical addition-polymerizable unsaturated carbon-to-carbon double contained in the adhesive layer and the unsaturated carbon-to-carbon double bond contained in the photosensitive resin composition, and becomes solvent-insoluble, and at the same time, these are firmly adhered to each other. The unexposed portion does not undergo polymerization, and is therefore removed by the solvent. Thus, a printing plate which can be immediately serviceable on a printing press is obtained. The adhesion of the support to the remaining reliefs is very strong, and is not attacked by the printing ink or solvent. Therefore, the printing plate obtained has very superior resistance to printing, and permits printing of several hundred thousand copies.

The following Examples illustrate the present invention in greater detail.

EXAMPLE 1

A tin-plated steel plate having a thickness of 0.3 mm was coated with an epoxy lacquer ("EPILITE", the product of Toa Paint Kabushiki Kaisha, Japan) containing red lead using a bar coater, and heat-treated for 20 minutes using hot air at 130° C. while driving off the solvent. A 25 $\mu$ thick primer layer having an antihalation effect was thus formed. A clear epoxy lacquer containing glycidyl methacrylate was blown against the antihalation layer using a spray gun. While gradually driving off the solvent, the plate was heat treated for 20 minutes at 100° C. to form a 15 $\mu$ thick non-tacky topcoat layer. The details of the epoxy lacquers used for providing the primer layer and the topcoat layer were as follows:

Epoxy lacquer for the primer layer

The lacquer was a uniform solution or dispersion of 20 parts by weight of an epoxy resin having an epoxy equivalent of $4 \times 10^{-3}$ eq./gr. and an average molecular weight of about 500 which had been obtained by the condensation of bisphenol A with epichlorohydrin, 15 parts by weight of an aliphatic polyamide resin with terminal amino groups having an amine equivalent of $1 \times 10^{-2}$ eq./gr. and about 20 parts by weight of red lead, in a thinner consisting mainly of toluene, diacetone alcohol and n-butanol. The lacquer had a solids content of about 60%. In actual use, however, a primer solution containing the epoxy resin and the red lead and a primer solution containing the polyamide resin were obtained separately, and mixed in the above proportions immediately before use.

Epoxy lacquer for the topcoat layer

The lacquer was prepared by mixing 40 parts of a solution containing 50% by weight of the same epoxy resin as used in the primer, 50 parts by weight of a solution containing 40% by weight of the same polyamide resin as used in the primer, 30 parts by weight of glycidyl methacrylate, and 20 parts by weight of the same thinner as used in the primer, several hours before use. Thus, the resulting top coat layer contained about 3 × 10⁻³ mol per gram of the coating of a vinyl group (

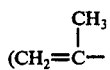

derived from the glycidyl methacrylate).

The support prepared above was then coated to a thickness of 0.7 mm with a viscous liquid photosensitive resin having a viscosity at 20° C. of about 50 poises and comprising a uniform mixture of 70 parts by weight of an unsaturated polyester resin having an acid value of 130 and obtained by heating 2 mols of fumaric acid, 1 mol of trimellitic anhydride, 1.5 mols of ethylene glycol and 1.5 mols of diethylene glycol, 23 parts by weight of polyethylene glycol diacrylate (the polyethylene glycol units having a degree of polymerization of 4), 1 part by weight of benzoin methyl ether, and 0.01 part by weight of hydroquinone. The coated support was exposed for 5 minutes to actinic light from an ultraviolet fluorescent lamp through an image-bearing negative film, and then washed with dilute aqueous alkali to form a relief printing plate. Even after printing 500,000 copies using this printing plate, the separation of the resin layer was not observed.

On the other hand, a printing plate was prepared in the same way as above except that the adhesive layer was formed using a clear epoxy lacquer not containing glycidyl methacrylate. In the resulting printing plate, the adhesion between the photosensitive resin and the support was very weak, and reliefs in halftone dots, especially small dots or line relief separated from the support merely by touching them with a finger. When 10,000 copies were printed using this printing plate, the relief portions in halftone dots, fine line relief or small independent dots separated from the support, and the printing plate was quite useless.

EXAMPLE 2

A 0.2 mm thick aluminum plate was coated to a thickness of 30 microns with an epoxy lacquer (Eton No. 2100) containing cyanine green, and immediately heat-treated at 120° C. for 30 minutes to form an adhesive layer containing an antihalation agent. The adhesive layer contained about 1.5 × 10⁻³ mol/gr. of a methyl-vinyl group.

The epoxy laxquer used above was prepared as follows:

20 parts by weight of an epoxy resin having a molecular weight of about 1100 and obtained by condensing bisphenol A with epichlorohydrin in an alkaline solution, 15 parts by weight of a reaction product of hexamethylene diamine and glycidyl methacrylate in a mole ratio of 1:2 (a viscous liquid obtained by dissolving the hexamethylene diamine and glycidyl methacrylate in a mixed solvent consisting of toluene, n-butanol and methyl cellosolve to a solids concentration of 30% by weight, and gradually heating them in the presence of methoxy phenol as an anti-gellation agent), 2 parts by weight of ethylene diamine as a curing agent, 7 parts by weight of cyanice green as an antihalation agent, and 80 parts by weight of a mixed solvent consisting of toluene, n-butanol and methyl cellosolve were mixed to prepare the lacquer. The lacquer was coated on the support immediately after preparation.

For comparison, the same procedure as above was repeated except that 2 parts by weight of p-phenylene diamine was used instead of 15 parts of weight of the reaction product formed between hexamethylene diamine and glycidyl methacrylate.

Reliefs of the photosensitive resin had poor adhesion, and separated from the support even by weak stress. This is because the coating of the support did not contain an active double bond.

EXAMPLE 3

Using the same epoxy resin used for the primer in Example 1 and the reaction product of 2 mols of hexamethylene diamine and 3 mols of allyl glycidyl ether (reacted in the same way as in Example 2 in the presence of methoxy phenol as a polymerization inhibitor), a lacquer of the following formulation was prepared.

| Formulation | Parts by weight |
|---|---|
| Epoxy resin | 20 |
| Reaction product of hexamethylene diamine and allyl glycidyl ether | 20 |
| Red iron oxide | 5 |
| Red lead | 15 |
| N,N-diethyl ethylene diamine as a curing agent | 0.5 |
| Thinner (mixed solvent consisting of toluene, diacetone alcohol, butyl acetate, and butanol in a ratio of 40:20:20:20) | 240 |

The resulting lacquer was coated on a 0.15 mm thick polyethylene terephthalate sheet which had been sand blasted, using a bar coater, and then the solvent was driven off. After evaporation of the solvent, the amount of the coating was about 7 g per m². The coated sheet was heat-treated for 60 minutes in a hot air dryer held at 80° C., whereupon the coating became non-tacky at the surface. The coating contained about 2 × 10⁻³ mol/gr. of vinyl group.

On the other hand, 30 parts by weight of a copolymer of methyl methacrylate and methacrylic acid (in a mol ratio of 70:30), 30 parts by weight of tetraethylene glycol dimethacrylate, 30 parts by weight of trimethylol propane trimethacrylate, 10 parts of polyethylene glycol having a molecular weight of 100,000, 2 parts by weight of benzoin ethyl ether, and 0.03 part of methyoxyhydroquinone were mixed to form a photosensitive resin which was liquid at room temperature.

The resulting resin was coated uniformly on the support to a thickness of 0.5 mm, and after drying, exposed for about 5 minutes to an actinic light from eight 20 watt fluorescent chemical lamps through an image-bearing negative film. The distance between the photosensitive resin plate and the lamps was 10 cm. Then, the exposed plate was washed out with a 0.3% aqueous solution of sodium hydroxide at 40° C.

The resulting printing plate was adhered to a printing cylinder using an adhesive tape, and printing was performed. The printing plate gave 300,000 printed copies in perfect condition, and was resistant to washing with an washing oil which was carried out during printing.

EXAMPLE 4

30 parts by weight of benzidine yellow was added to 100 parts by weight of the same Epilite clear solution (containing 50% by weight of the epoxy resin) as used in the topcoat in Example 1, and they were thoroughly mixed by milling. Separately, 16 parts by weight of glycidyl methacrylate was reacted with 100 parts by weight of the same Epilite clear solution (containing 40% by weight of the polyamide resin) as used for the topcoat in Example 1, in the presence of 0.2% by weight of hydroquinone at a temperature of 130° C. for 60 minutes to form a polyamide resin having a double bond.

a. A lacquer was prepared by mixing 100 parts by weight of the solution prepared above and containing the yellow pigment, 85 parts by weight of the polyamide resin solution prepared above, and 1 part of triethylene tetramine as a curing agent.

Immediately after preparation, the lacquer was coated on a 0.3 mm thick polycarbonate film to a thickness of 5 microns, and the solvent was driven off. Furthermore, the coated film was heat-treated for 15 minutes at 100° C. The resulting coating was non-tacky. The adhesive coating contained about $7 \times 10^{-4}$ mol/gr of a methylvinyl group.

b. A lacquer solution was prepared in the same way as in (a) above except that triethylene tetramine was not added. The solution was aged for about one day at room temperature, and coated in the same way as in (a) above. Then, the coating was cured by heating under the same conditions as in (a) above.

In each of (a) and (b) above, the support prepared exhibited a very superior adhesive effect as a support for a printing plate of an unsaturated polyester type photosensitive resin same as used in Example 1.

EXAMPLE 5

The procedure of Example 1 was repeated except that the lacquer for the top coat used in Example 1 was aged for 2 days at 30° C. after preparation. In this case, even when the lacquer was dried with hot air immediately after its application, the glycidyl methacrylate was completely fixed to the coated film. Another precise experiment showed that the coated film contained about $5 \times 10^{-3}$ mol/gr. of a methylvinyl group. The adhesive strength of the resulting adhesive layer to the photosensitive resin was very superior as in Example 1.

On the other hand, the procedure of Example 1 was repeated except that immediately after spraying the top coat lacquer on the support, it was heated for 20 minutes in a hot air duct held at 100° C. while driving off the solvent. The resulting coated film was about 13 microns in thickness, and was non-tacky. However, the coating obtained had a methylvinyl group content of less than $10^{-4}$ mol/gr. probably because the glycidyl methacrylate was driven off in a considerable amount as a result of heating the coating immediately after application.

EXAMPLE 6

A 0.27 mm thick steel plate having a chromic acid-treated surface was coated with the same primer lacquer and the topcoat lacquer used in Example 5. The resulting support was coated with a clear liquid photosensitive resin consisting of 35 parts by weight of methyl cellulose, 65 parts by weight of triethylene glycol diacrylate, 3 parts of anthraquinone and 0.03 part of hydroquinone. The resin plate was exposed through an image-bearing negative film, and washed out in the same way as in Example 5.

A portion of the resulting printing plate containing a relief image (line relief having a height of 0.7 mm, a width of 100 microns, and a length of 5 mm) was cut out as a test sample, and the tensile strength required to separate the relief image from the support in the vertical direction was measured. It was found that when the support plate was not aged, the tensile strength required for separation was 2 Kg/5 mm relief, and when the support plate was aged, it was 8 Kg/5 mm relief.

EXAMPLES 7 AND 8

Eqikote 1001 (trademark for the product of Shell Chemical Co., an epoxy resin synthesized from bisphenol A and epichlorohydrin and having a molecular weight of about 900 and epoxy groups at both ends of the molecular chain) was dissolved in the same solvent as used in Example 1 to form a 20% by weight solution. Methacrylic acid was added to the solution in an amount of ½ equivalent based on the epoxy groups present in the expoxy resin. As a polymerization inhibitor, 0.2% by weight based on solids content of N-nitrosodiphenylamine was added, and the about 1% by weight based on solids content of LiCl as a catalyst was added. The mixture was reacted at 60° to 80° C. for about 4 hours. Samples of the product was occasionally withdrawn from the reaction system, and the acid values of the samples were measured to trace the reaction.

Using the resulting epoxy acrylate resin containing both an epoxy group and a vinyl group, lacquers for an adhesive layer were prepared in accordance with the following formulations.

| Formulation of the lacquer for Example 7 | Parts by weight |
|---|---|
| Epikote 834 (an epoxy resin having a molecular weight of about 450 and derived from bisphenol A and epichlorohydrin) | 10 |
| Epoxyacrylate resin | 15 |
| Polyamide resin curing agent used in Example 1 | 15 |
| Red lead | 10 |

| Formulation of the lacquer for Example 8 | Parts by weight |
|---|---|
| Novolac-epoxy resin (having a viscosity of 3800 centipoises at 25° C. and a molecular weight of about 390, and containing 2.1 epoxy groups on an average per molecule) | 10 |
| Epoxyacrylate resin | 15 |
| Polyamide resin curing agent used in Example 1 | 15 |
| Red lead | 10 |
| Thinner used in Example 1 | the amount such that the concentration of the solution is 40% by weight |

Each of the two lacquers was coated in a customary manner on the same support as used in Example 6 to a thickness of about 20 microns. The curing time was about 15 minutes at 110° C. The resulting coating immediately after curing was non-tacky and of superior quality, but was further completely cured after allowing it to stand at room temperature for 1 week. The amount of a methylvinyl group contained in each one gram of the coating was about $3 \times 10^{-4}$ mol in each of these Examples.

Then, using the same unsaturated polyester-type liquid photosensitive resin as used in Example 1, printing plates having relief images were prepared as in Example 6. The tensile strength required to separate the relief images from the support was measured, and found to be 5 to 7 Kg/5 mm. relief in each of the Examples. This means that the printing plates can be sufficiently serviceable.

EXAMPLE 9

A lacquer was prepared from 20 parts by weight of the same epoxy resin used in Example 1, 20 parts by weight of the same epoxyacrylate resin as synthesized in Example 7, 10 parts by weight of the same polyamide resin curing agent as used in Example 1, and the same thinner as used in Example 1 (in an amount such that the solids concentration of the lacquer became 40% by weight). The resulting lacquer was applied as a topcoat in thickness of about 10 microns to the same support as used in Example 1 which had been coated with the primer and the antihalation layer. The solvent was driven off, and the coating was cured sufficiently for 30 minutes in hot air at 110° C.

The topcoat of the resulting support contained about $4 \times 10^{-4}$ mol/gr of a methylvinyl group.

The same liquid photosensitive resin as used in Example 1 was coated on the resulting support, and reliefs were provided on it imagewise in a customary manner, to form a printing plate. It was found that very clear printed copies could be obtained using this printing plate even after 1 million copies were printed on it.

EXAMPLE 10 (CONTROL)

An adhesive layer composition was formulated in the following manner.

| Formulation | Parts by weight |
| --- | --- |
| Epikote 1001 (a product of Shell Chemical Co., an epoxy resin synthesized from bisphenol A and epichlorohydrin, and having a molecular weight of about 900 and epoxy groups at both ends of molecular chain) | 40 |
| P-chlorobenzene diasonium hexafluorophosphate | 0.9 |
| Glycidylmethacrylate | 20 |
| Red iron oxide | 10 |
| Thinner used in Example 1 | 60 |

Using a spray gun, the abovementioned adhesive composition was sprayed onto an aluminum plate, which was then dried at 60° C. for 10 minutes while the thinner was being driven off. The support plate thus prepared was then exposed for 30 minutes to light from a 4KW super high pressure mercury lamp to thereby effect curing of the adhesive layer. The adhesive layer had a thickness of 4μ.

The photosensitive resin prepared in Example 1 was coated onto this support plate in a thickness of 0.7 mm, and tensile strength of the coated support was measured in the same way as in Example 6. It was found that the coated support had a tensile strength of 2 Kg per 5 mm relief, and could not therefore be servicable as a printing plate.

It is believed that an adhesion strength of the photosensitive resin is weakened possibly because the curing agent used for curing the adhesive layer produces radicald upon photolysis which in turn react and consume the double bonds of glycidyl methacrylate.

EXAMPLE 11 (CONTROL)

An adhesive composition was prepared using the same formulation as in Example 8 except that the epoxyacrylate resin was not included. Using this adhesive composition, a support was prepared in the like manner as in Example 8.

Tensile strength of the resulting support was measured in the same manner as in Example 6, and found to be 1.5 Kg per 5 mm relief. Accordingly, the support plate was found to be unservicable as a printing plate.

What we claim is:

1. A support for a photosensitive resin for use in making a printing plate using liquid photosensitive resin, said support comprising a flexible self-supporting base plate and an adhesive layer formed thereon for applying a layer of the photosensitive resin, wherein said adhesive layer is a three-dimensional cured product containing $1 \times 10^{-4}$ to $1 \times 10^{-2}$ mol/gr. of effectively photopolymerizable unsaturated carbon-to-carbon double bonds, which have been formed from a composition consisting of (A), (B) and (C) as shown below:

A. a compound which is a linear polycondensation product formed between epichlorohydrin and polyhydric phenolic compound, the polycondensation product having a molecular weight of up to 4,000 and containing 1,2-epoxy groups at both terminals, or a diepoxy ester compound selected from the group consisting of diglycidyl-2,6-naphthalenedicarboxylate, diglycidyl-2,7-naphthalenedicarboxylate, diglycidyl o-phthalate, diglycidyl isophthalate, diglycidyl terephthalate, diglycidyl methylisophthalate, and diglycidyl methylterephthalate;

B. a compound selected from one of the group comprising
      i. a compound containing an effectively photopolymerizable unsaturated carbon-to-carbon double bond moiety having the formula

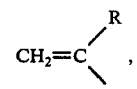

wherein R is a hydrogen or an alkyl and a 1,2-epoxy group in the molecule and having a boiling point of at least 120° C., or
      ii. a reaction product of the component (B) (i) with an amine curing agent selected from the group consisting of aliphatic amines, aromatic amines and amino-terminated polyamide resin obtained by the condensation of an aliphatic dicarboxylic acid with ethylene diamine and having a degree of polymerization of 5 to 20, the reaction product containing an effectively photopolymerizable unsaturated carbon-to-carbon double bond moiety having the formula

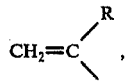

wherein R is hydrogen or an alkyl, and an amino group in the molecule and having a boiling point of at least 120° C.; and C. an organic curing agent for epoxy resins containing at least two active hydrogen atoms but not containing an effectively photopolymerizable carbon-to-carbon double bond, or an organic compound convertible to said curing agent during the reaction, and selected from the group consisting of: aliphatic amines, aromatic amines, polycarboxylic acids, acid anhydrides, phenol resins, urea resins, polyester resins, polysulfide resins, melamine resins, and polyamide resins.

2. The support of claim 1 wherein said component (A) is a linear polycondensation product formed between epichlorohydrin and a polyhydric phenolic compound.

3. The support of claim 1 wherein said component (B) (i) is a member selected from the group consisting of glycidyl acrylate, glycidyl methacrylate and an epoxyacrylate resin.

4. The support of claim 1 wherein said curing agent of component (C) is a polyamide resin.

5. The support of claim 1 wherein the proportion of said component (B) (i) or (B) (ii) is 0.5 to 5 times the weight of said component (A).

6. The support of claim 1 wherein said curing agent of component (C) is a poly carboxylic acid.

7. The support of claim 1 wherein said organic compound of component (C) is a poly-carboxylic acid anhydride.

8. The support of claim 1 wherein said adhesive layer contains from $1 \times 10^{-3}$ to $4 \times 10^{-3}$ mol per gram of the carbon-to-carbon double bond.

9. The support of claim 1 wherein component (B) (i) is present.

10. The support of claim 9 wherein the components are present in the proportions of
A. — 10 to 70% by weight
B. (i) — 10 to 88% by weight, and
C. — 2 to 80% by weight,
the sum of the components being 100% by weight.

11. The support of claim 1 wherein component (B) (ii) is present.

12. The support of claim 11 wherein the components are present in the proportions of
A. — 10 to 70% by weight,
B. (ii) — 30 to 80% by weight, and
C. — 1 to 60% by weight,
the sum of the components being 100% by weight.

13. A process for producing a support for photosensitive resin for use in making a printing plate using a liquid photosensitive resin, said process comprising the steps of applying, onto a flexible self-support base plate, and adhesive composition consisting of (A), (B) and (C) as shown below:

A. a compound which is a linear polycondensation product formed between epichlorohydrin and polyhydric phenolic compound, the polycondensation product having a molecular weight of up to 4,000 and containing 1,2-epoxy groups at both terminals or a diepoxyester compound selected from the group consisting of diglycidyl-2,6-naphthalenedicarboxylate, diglycidyl-2,7-naphthalenedicarboxylate, diglycidyl o-phthalate, diglycidyl isophthalate, diglycidyl terephthalate, diglycidyl methylisophthalate, and diglycidyl methylterephthalate;

B. a compound selected from one of the group comprising
i. a compound containing an effectively photopolymerizable unsaturated carbon-to-carbon double bond moiety having the formula

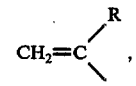

wherein R is hydrogen or an alkyl, and a 1,2-epoxy group in the molecule and having a boiling point of at least 120° C., or ii. a reaction product of the component (B) (i) with an amine curing agent selected from the group consisting of aliphatic amines, aromatic amines, and amino-terminated polyamide resin obtained by the condensation of an aliphatic dicarboxylic acid with ethylene diamine and having a degree of polymerization of 5 to 20, the reaction product containing an effectively photopolymerizable unsaturated carbon-to-carbon double bond moiety having the formula

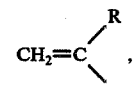

wherein R is hydrogen or an alkyl, and an amino group in the molecule and having a boiling point of at least 120° C.; and C. an organic curing agent for epoxy resins containing at least two active hydrogen atoms but not containing an effectively photopolymerizable carbon-to-carbon double bond, or an organic compound convertible to said curing agent during the reaction, and selected from the group consisting of: aliphatic amines, aromatic amines, polycarboxylic acids, acid anhydrides, phenol resins, urea resins, polyester resins, polysulfide resins, melamine resins, and polyamide resins; and then heating the adhesive composition to a temperature from 50° C. to 180° C. so as to thereby cure it three-dimensionally on the flexible self-supporting base plate in a fashion such that an adhesive layer containing $1 \times 10^{-4}$ to $1 \times 10^{-2}$ mol/gr. of an effectively photopolymerizable unsaturated carbon-to-carbon double bond is formed on the flexible self-supporting base plate.

* * * * *